(12) United States Patent
Kagan

(10) Patent No.: US 7,337,081 B1
(45) Date of Patent: Feb. 26, 2008

(54) METERING DEVICE WITH CONTROL FUNCTIONALITY AND METHOD THEREOF

(75) Inventor: Erran Kagan, Great Neck, NY (US)

(73) Assignee: Electro Industries/Gauge Tech, Westbury, NY (US)

( * ) Notice: Subject to any disclaimer, the term of this patent is extended or adjusted under 35 U.S.C. 154(b) by 0 days.

(21) Appl. No.: 11/341,802

(22) Filed: Jan. 27, 2006

Related U.S. Application Data

(60) Provisional application No. 60/647,669, filed on Jan. 27, 2005.

(51) Int. Cl.
| | |
|---|---|
| G06F 19/00 | (2006.01) |
| G06F 17/40 | (2006.01) |
| G06F 17/10 | (2006.01) |
| G01R 11/00 | (2006.01) |
| G01R 11/48 | (2006.01) |
| G01R 11/56 | (2006.01) |
| G01R 13/00 | (2006.01) |
| G01R 13/02 | (2006.01) |
| G01R 21/00 | (2006.01) |
| G01R 21/06 | (2006.01) |
| G01R 22/00 | (2006.01) |

(52) U.S. Cl. ............... 702/60; 324/76.11; 324/103 R; 324/140 R; 324/500; 324/510; 340/500; 340/635; 340/652; 361/1; 361/35; 361/56; 361/57; 361/62; 361/79; 361/86; 361/88; 361/603; 361/673; 700/22; 700/292; 700/293; 702/57; 702/58; 702/61; 702/64; 702/187; 702/189; 705/412

(58) Field of Classification Search ............ 324/103 R, 324/103 P, 115, 140 R, 140 D, 141, 142, 324/500, 509, 510, 511, 76.11; 340/635, 340/637, 638, 646, 649, 650, 652, 653, 660, 340/662, 500; 361/1, 18, 23, 30, 31, 35, 361/38, 42, 56, 57, 62, 78, 79, 86, 87, 88, 361/90, 600, 601, 602, 603, 659, 673; 700/22, 700/286, 292, 293, 294, 297, 298; 702/57, 702/58, 60, 61, 64, 127, 187, 189; 705/412
See application file for complete search history.

(56) References Cited

U.S. PATENT DOCUMENTS

| | | | | |
|---|---|---|---|---|
| 3,824,441 | A | * | 7/1974 | Heyman et al. ............... 363/37 |
| 4,884,021 | A | * | 11/1989 | Hammond et al. ......... 324/142 |

(Continued)

*Primary Examiner*—Edward R Cosimano
(74) *Attorney, Agent, or Firm*—Gerald E. Hespos; Anthony J. Casella; Michael J. Porco

(57) ABSTRACT

A metering device of a power substation and method are provided for operating on a secondary analog waveform output by a transformer assembly receiving a primary waveform. The method includes stepping down the secondary waveform and generating a corresponding output signal; operating on the corresponding output signal for generating a corresponding first digital signal having a value proportional to the corresponding output signal and within a first range; and operating on the corresponding output signal for generating a corresponding second digital signal having a value proportional to the corresponding output signal and within a second range. The method further includes processing the first digital signal and outputting a corresponding first output signal; processing the second digital signal and outputting a corresponding second output signal; processing the first and second output signals; and generating output corresponding to the processing of the first and second output signals.

44 Claims, 3 Drawing Sheets

U.S. PATENT DOCUMENTS

| | | | |
|---|---|---|---|
| 4,996,646 A | * | 2/1991 | Farrington .................. 700/293 |
| 5,166,887 A | * | 11/1992 | Farrington et al. ......... 700/293 |
| 5,170,360 A | * | 12/1992 | Porter et al. ................ 700/293 |
| 6,018,690 A | * | 1/2000 | Saito et al. ................. 700/295 |
| 6,098,175 A | * | 8/2000 | Lee ............................ 713/320 |
| 6,167,329 A | * | 12/2000 | Engel et al. ............... 361/93.2 |
| 6,528,957 B1 | * | 3/2003 | Luchaco ..................... 315/307 |
| 2003/0187550 A1 | * | 10/2003 | Wilson et al. .............. 700/295 |

* cited by examiner

METERING DEVICE WITH CONTROL FUNCTIONALITY AND METHOD THEREOF

PRIORITY

This application claims priority under 35 U.S.C. § 119 to now expired U.S. Provisional Application Ser. No. 60/647,669, filed on Jan. 27, 2005, and entitled "Substation Grade Meter with Circuit Protection Functions", the entire contents of which are expressly incorporated herein in their entirety.

BACKGROUND

This disclosure relates generally to a metering device with control functionality and method thereof, and more particularly to a metering device with control functionality for providing for integration of first and second operations on an input signal within the metering device, wherein the first and second operations have first and second biasing requirements.

An electrical power utility system performs one or more functions, such as generating, transmitting, distributing, measuring, and monitoring energy. Such an electrical power utility system may utilize, for example, a grid of power lines, transformers, circuit breakers, meters, display devices, processors, etc. One type of power utility system is a power substation. Power lines deliver energy to power substations for the power substation to operate on the energy, such as for performing operations including step-up operations, step-down operations, distribution, telemetry, panel annunciation, revenue metering, detection of abnormal energy conditions and/or protection from dangerous energy conditions.

A set of external voltage and/or current transformers provide energy to a power substation equipment, where the equipment may perform more than one operation on the input energy. However, biasing requirements (e.g., component input requirements) for the equipment performing the respective operations are generally substantially different, such due to accuracy requirements and operating ranges need for the respective operations. For example, panel metering equipment (e.g., for measuring energy usage in real-time and telemetry to an outside destination) and revenue metering equipment (e.g., for accurately measuring energy usage) have first biasing requirements in order for the panel or revenue metering equipment to operate with a high degree of accuracy on a relatively small range of low energy, such as currents ranging between 0-10 amps. Secondary protective circuit relaying equipment (e.g., for protecting equipment in the power substation from dangerous conditions, such as over voltage, under voltage, energy faults, short circuits, reverse power, etc.) have second biasing requirements in order for the protective relaying equipment to operate on a relatively large range of energy, such as currents ranging between 0-100 amps, where a high degree of accuracy is not required.

Due to the difference in biasing requirements, first digital processing equipment having a first internal transformer is used for the metering equipment, generating corresponding output signals and handling the output signals, such as for generating communication transmissions, generating a display to be displayed on a display device, generating control signals, and generating analog retransmit signals. Second digital processing equipment having a second internal transformer is used for detecting dangerous conditions, generating corresponding output signals and handling the output signals, such as for the purpose of communication transmission, display, control of protective devices, such as circuit breakers, and conversion to analog for retransmission of analog signals. The need for first and second digital and/or processing equipment to handle outputs corresponding to metering and condition detection adds to overall cost, including added cost for the additional digital and/or processing equipment, control panel size, wiring time, and complexity of the drawings and schematics. Furthermore, there is a lack of coordination between the metering and protection operations and/or processing or operating on their respective outputs.

To overcome the drawbacks in the prior art, it is an aspect of the present disclosure to provide a system and method for sharing equipment to be used in conjunction with performing operations having different input, operating range and/or accuracy requirements.

Furthermore, it is an aspect of the present disclosure to provide a system and method for providing coordination between the metering and protective operations and/or processing or operating on the respective outputs.

SUMMARY

Accordingly, it is an aspect of the present disclosure to provide a system and method for sharing digital and/or processing equipment to be used in conjunction with metering and protective functions.

In accordance with one aspect of the present disclosure, there is provided a metering device of a power substation operating on a secondary analog waveform output by a transformer assembly receiving a primary waveform. The metering device includes a transformer for stepping down the secondary waveform and generating an output signal; first biasing circuitry for operating on the signal output from the transformer for generating a corresponding first digital signal having a value proportional to the signal output from the transformer and within a first range, and second biasing circuitry for operating on the signal output from the transformer for generating a corresponding second digital signal having a value proportional to the signal output from the transformer and within a second range. Additionally, the metering device includes a processor assembly in operative communication with the first and second biasing circuitry, wherein the processor assembly executes application software for receiving the first and second digital signals. The processor assembly includes a first operational software block for processing the first digital and outputting a corresponding first output signal, a second operational software block for processing the second digital signal and outputting a corresponding second output signal, and a control software block for processing the first and second output signals and generating corresponding output.

Pursuant to another aspect of the present disclosure, there is provided a method for operating on a secondary analog waveform output by a transformer assembly receiving a primary waveform. The method includes stepping down the secondary waveform and generating a corresponding output signal; operating on the corresponding output signal for generating a corresponding first digital signal having a value proportional to the signal output from the transformer and within a first range; operating on the corresponding output signal for generating a corresponding second digital signal having a value proportional to the signal output from the transformer and within a second range; processing the first digital signal and outputting a corresponding first output signal; processing the second digital signal and outputting a corresponding second output signal; processing the first and second output signals; and generating output corresponding to the processing of the first and second output signals.

Pursuant to still another aspect of the present disclosure, there is provided a processor assembly executing application software for receiving first and second digital signals corresponding to a secondary waveform output by a transformer assembly of a power substation in response to the transformer assembly operating on a primary waveform. The first digital signal is biased to have a value within a first range, and the second signal is biased to have a value within a second range. The processor assembly includes a first operational software block for processing the first digital signal and outputting a corresponding first output signal; a second operational software block for processing the second digital signal and outputting a corresponding second output signal; and a control software block for processing the first and second output signals and generating corresponding output.

BRIEF DESCRIPTION OF THE DRAWINGS

Various embodiments of the present disclosure will be described herein below with reference to the figures wherein.

DETAILED DESCRIPTION OF THE PREFERRED EMBODIMENTS

Figure 1:
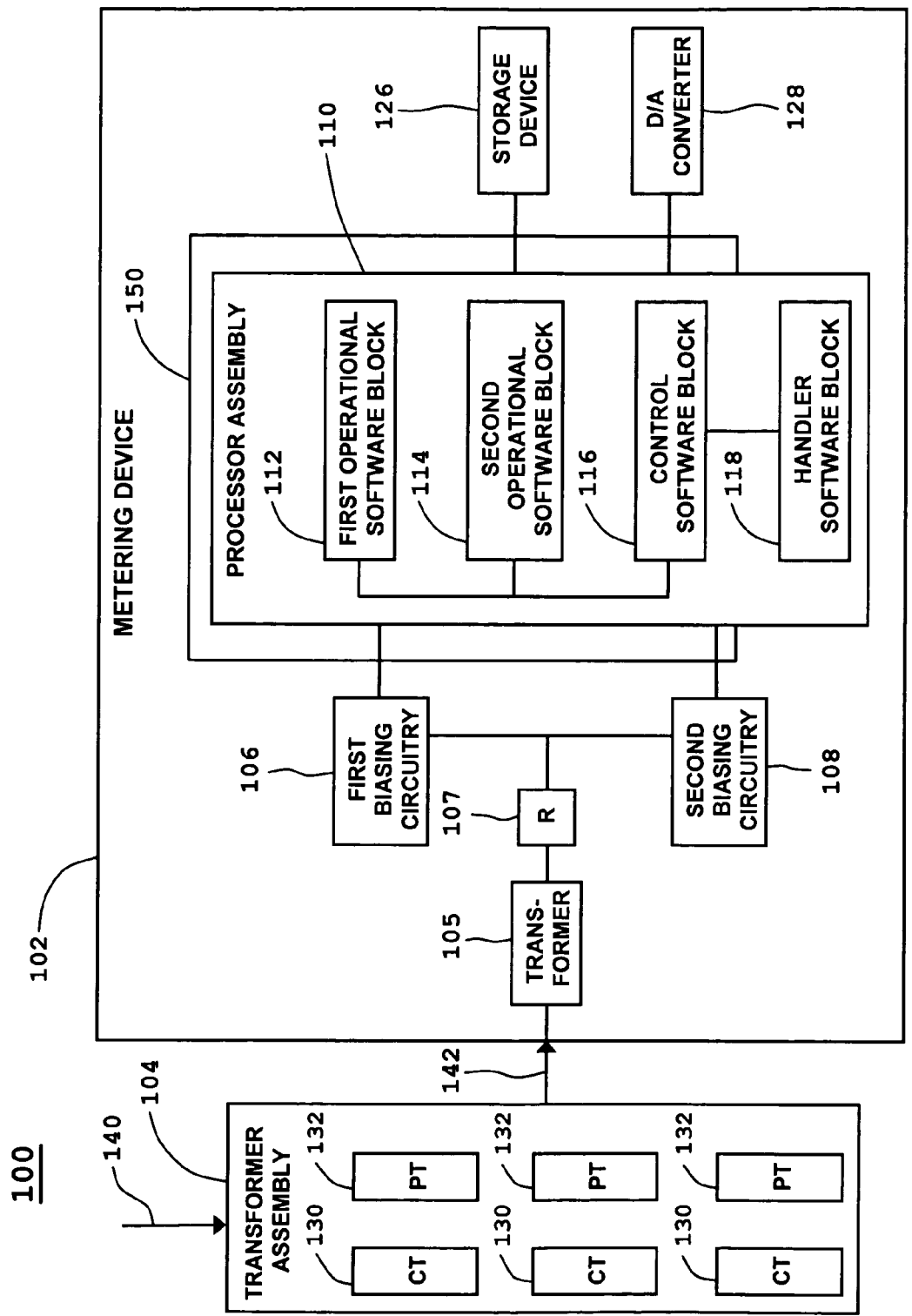
FIG. 1 is a schematic block drawing of a first embodiment of a power substation in accordance with the present disclosure.

For a general understanding of the features of the present disclosure, reference is made to the drawings. In the drawings, like reference numerals have been used throughout to identify identical elements. With reference to FIG. 1, an exemplary power substation 100 is shown having a substation utility metering device 102 and a transformer assembly 104. The substation 100 may perform one or more functions such as transmitting, distributing, stepping-up, stepping-down, measuring, and/or performing protective operations on electrical energy. The metering device 102 includes transformer 105, resistor 107, first biasing circuitry 106, second biasing circuitry 108 and a processor assembly 110. The processor assembly 110 includes a first operational software block 112, a second operational software block 114, a control software block 116, and a handler software block 118. The processor assembly 110 is operatively coupled with a storage device 126 and an analog-to-digital converter (DAC) 128.

The transformer assembly 104 includes at least one current transformer (CT) 130 and at least one potential transformer (PT) 132. A primary waveform 140 is provided to the transformer assembly 104 from a source, such as a power generator station or a power distribution substation (not shown). The transformer assembly 104 operates on the primary waveform 140 and outputs a corresponding secondary waveform 142 which may be provided to a load (not shown) and provided to the metering device 102. The metering device 102 is typically operatively coupled in parallel with signal 142. The CTs 130 and PTs 132 are configured to operate on the primary waveform 140 for transforming the primary waveform 140 into a waveform having a current and potential that have a magnitude that can be operated on by the metering device 102, such as by performing a step-down operation. Furthermore, the PTs 132 are configured to provide a known and accurate voltage via the secondary waveform 142. An exemplary power substation receives a primary waveform 140 having a voltage of 139 kV and a current of 600 amps, and outputs a secondary waveform 142 having a voltage of 120 V and a current of 5 amps.

The processor assembly 110 of the metering device 102 includes at least one processor for executing application software, where the at least one processor may include a digital signal processor (DSP), microprocessor, personal computing device, an application-specific integrated circuit (ASIC), etc. Each of the software blocks 112, 114, 116 and 118 includes a series of programmable instructions capable of being executed by the processor assembly 110. The series of programmable instructions can be stored on a computer-readable medium, such as storage device 126, RAM, a hard drive, CD, smart card, 3.5" diskette, etc., or transmitted via propagated signals for being executed by the processor assembly 110 for performing the functions disclosed herein and to achieve a technical effect in accordance with the disclosure. Additionally, the processor assembly 110 or a portion thereof may not be included in the metering device 102 or the power substation 100, and may be remote from the metering device 102 or the power substation 100.

The functions of the respective software blocks may be distributed among a different combination of software blocks. One or more of the software blocks 112, 114, 116 and 118 may be executed by a dedicated processor of the at least one processor, and a processor of the at least one processor may execute more than one of the software blocks 112, 114, 116 and 118. The processors of the at least one processor operatively communicate with one another via wired or wireless communication or a shared memory, such as via a dual port RAM or a serial bus. Optionally, the first and second operational software blocks 112 and 114 are isolated from one another so that one of the operational software blocks does not interfere with the operation of the other operational software block. As described below, upon detection of an error condition, one of the operational software blocks 112, 114 may be provided with the capability of resetting the other operational software block 112, 114, even when the software blocks 112 and 114 are otherwise isolated. The isolation may be functional and based on software. Furthermore, in a configuration in which the first and second operational software blocks 112 and 114 are executed by first and second processors, respectively, of the at least one processor, the first and second processors may be operationally and/or physically isolated from one another.

In one embodiment of the present disclosure, the processor(s) of the processor assembly 110 that execute the first operational software block 112, the second operational software block 114 and the control software block 116 are disposed in a common housing 150. Accordingly, the processors of the first operational software block 112, second operational software block 114 and the control software block 116 share a common physical platform and may be configured in a single physical unit. Housing 150 may further house the transformer 105, the resistor 107, first biasing circuitry 106, the second biasing circuitry 108, the storage device 126, the DAC 128, and/or the processor(s) of the processor assembly 110 that execute the handler software block 118. Accordingly, the entire metering device 102 or selected components thereof may be configured as one physical unit.

The metering device 102 performs a combination of functions including, for example, measuring energy usage per client for revenue purposes (e.g., where the substation is a point of common coupling for billable customers); measuring real-time energy usage, display of real-time energy usage, telemetry of real-time energy usage; and monitoring voltage and current received and operated on by the metering device 102 for determining if the monitored levels are within normal parameters and/or indicate the need for protective measures. The first operational software block 112 performs a first function of the functions of the metering device 102, and the second operational software block 114 performs a second function of the functions of the metering device 102, where the first and second functions have first and second biasing requirements. The control software block 116 operates on outputs from the first and second operational software blocks 112 and 114 in a coordinated fashion. For example, the control software block 116 may store, process and/or generate output based on the output of the first and/or second operational software blocks 112 and 114.

Output generated by the control software block 116 may be provided to storage device 126 for storage thereof, after which it may be further processed by processor assembly 110 or output to a destination. Output generated by the control software block 116 may be provided to DAC 128 for conversion to an analog signal which may be output from the metering device 102, e.g., as an analog retransmit signal for provision to an analog device, such as an older model metering device. Furthermore, output generated by the control software block 116 may be provided as one or more control signals for controlling at least one device, e.g., a relay (not shown), where the at least one may device may be integrated with the metering device 102 and/or external thereto controlled for example by a digital output signal. An example of a device that may be controlled by output generated by the control software block 116 includes a circuit breaker for disabling energy transmission along a selected electrical path.

Additionally, output generated by the control software block 116 may be provided to the handler software block 118, such as for providing the output to one or more devices (not shown). The handler software block 118 may include one or more handlers, such as a communication input/output (I/O) handler, a display handler, and an indicator handler. The communication I/O handler interfaces with a communication I/O device such as an I/O port (not shown), such as for transmitting information serially, in parallel, using an Ethernet protocol, or using an Internet protocol, etc., to a source that is remote or integrated with the metering device 102. Information transmitted via the communication I/O device may be, for example, revenue data measured by one of the operational software blocks 112 or 114.

The display handler interfaces with a display device (e.g., an LCD display, a computer screen, etc., not shown) for providing output generated by the control software block 116 to the display device for display thereof. Accordingly, real-time energy use measured by the metering device 102 or an alert due to a detected condition may be displayed by the display device. The indicator handler interfaces with an indicator device (e.g., an indicator light or audio buzzer device, not shown) for providing output generated by the control software block 116 to the indicator device, such as for alerting an operator upon detection of a condition by the condition detector software block 114.

The control software block 116 may further by operationally coupled with a user interface (UI) handler (which may also be included in the handler software block 118) providing an interface with a user interface device (not shown). The user interface device is operable by an operator for accepting information input by the operator, such as data or user requests. The user interface device may include, for example, a user input device (keyboard, mouse, control switch, etc.) and may interact with a graphical user interface (GUI) displayed via the display device.

The control software block 116 may monitor the first and second operational software blocks 112 and 114 to check for valid operation thereof, such as reconciling output from both of the first and second operational software blocks 112 and 114, including detecting a deviation or discrepancy between the outputs of both operational software blocks 112 and 114 indicative of a malfunction or error condition. The first operational software block 112, the second operational software block 114 and the control software block 116 may each monitor one another for detecting conditions indicative of a malfunction or error, such as by performing parity and/or checksum checks. Each of (or a combination of) the software blocks 112, 114 and 116 may be provided with the capability of performing a reset operation on either or both of the other two software blocks and/or itself in response to detection of a condition indicative of a malfunction or error. Reset lines of the processors of the at least one processor may be tied together, enabling one processor to reset another processor, such as on upon detection of an error condition.

The first and second biasing circuitry 106 and 108 are operatively coupled to the processor assembly 110, and may be wholly or partially integrated with the processor assembly 110 or external thereto. First and second biasing circuitry 106 and 108 each include one or more of the following devices: an analog-to-digital converter (ADC), an amplifier (e.g., an operational amplifier), a driver, filtering circuitry, buffering circuitry, etc.

The secondary waveform 142 is stepped down by transformer 105 and fed through resistor 107, or the equivalent, to the first biasing circuitry 106 and the second biasing circuitry 108. The first biasing circuitry 106 operates on the output from the transformer 105 and resistor 107 for generating a corresponding first biased signal having a current and voltage within a first range of voltages and currents, where the ADC of the first biasing circuitry 106 converts the first biased signal and outputs a first digital signal that has a value within the first range. The second biasing circuitry 108 operates on the output from transformer 105 and resistor 107 for generating a corresponding biased second signal having a current and voltage within a second range of voltages and currents, where the ADC of the second biasing circuitry 106 outputs a second digital signal that has a value within the second range. The second range is substantially larger than (e.g., at least double) the first range for establishing a large and dynamic range without the need for a high degree of accuracy. In contrast, the first range is small and allows for a high degree of accuracy. The first operational software block 112 receives the first digital signal from the first biasing circuitry 106, and the second operational software block 114 receives the second digital signal from the second biasing circuitry 108.

In operation, the transformer assembly 104 receives the primary waveform 140, and transforms the primary waveform 140 into a secondary waveform 142 which is provided to the metering device 102. The secondary waveform 142 is provided to the transformer 105 and resistor 107 which provide output to each of the first and second biasing circuitry 106 and 108. The first biasing circuitry 106 operates on the output from the transformer 105 and resistor 107 for converting it into the first digital signal having a first range, e.g., 0-10 amps, using a first biasing gain, where the first range covers the full range of the nominal or expected secondary waveform 142, but is not substantially more than twice the secondary waveform 142

The second biasing circuitry 108 operates on the output from the transformer 105 and resistor 107 for converting it into the second digital signal having a second range (of approximately 0-100 amps in the present example) using the second biasing gain, where the second range covers at least two times the full range of the secondary waveform 142, and ten times the full range of the secondary waveform 142 in the present example.

The processor assembly 110 receives the output from the first and second biasing circuitry 106 and 108. The first operational software block 112 is executed by the processor assembly 110 for processing the output from the first biasing circuitry 106 and generating a first output. In the present example, the first operational software block 112 performs a metering operation on the signal received from the first biasing circuitry 106, such as measuring real-time energy usage or cumulative energy usage per customer. The second operational software block 114 is executed by the processor assembly 110 for processing the output from the second biasing circuitry 108 and generating a second output. In the present example, the second operational software block 114 performs a condition detection operation on the signal received from the second biasing circuitry 108, such as detecting conditions indicative of potential danger for protection purposes. In the present example, operation on the signal received from the first biasing circuit 106 by the first operational software block 114 is isolated from operation on the signal received from the second biasing circuit 108 by the second biasing circuit 108, however the disclosure is not limited to such isolation. The control software block 116 processes the first and second output signals for generating outputs, which may include outputs to a display device, communication I/O port, control signals to a device, DAC 128 for generating analog retransmit signals, etc.

Figure 2:
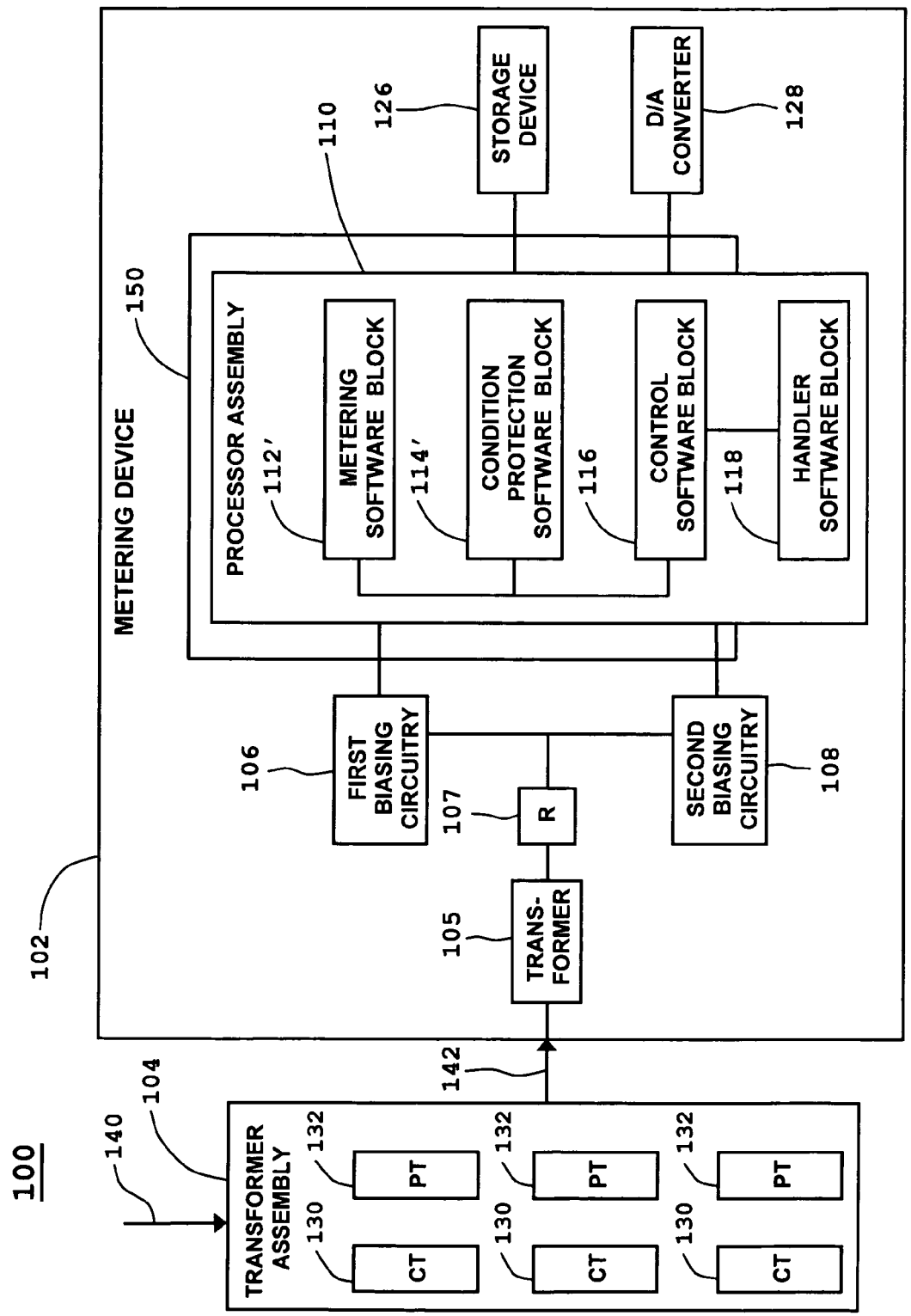
FIG. 2 is a schematic block drawing of a second embodiment of the power substation in accordance with the present disclosure.

With reference to FIG. 2, the first operational software block 112 is shown as an exemplary metering software block 112' that performs digital metering functions, including at least one of measuring energy utilized by a load in real-time (also known as panel metering) and measuring cumulative energy usage per customer (also known as revenue metering). The metering software block 112' receives a digital signal from the first biasing circuitry 106 for looking at the full load (which in the present example ranges between 0-5 amps) that is output as the secondary waveform 142 by the transformer assembly 104 for making highly accurate measurements. In the present example the first range of the ADC of the first biasing circuitry 106 at least covers the range of the full load of the secondary waveform 142, and may be up to substantially double the full load of the secondary waveform 142 (e.g., the first range is about 0-10 amps) for preserving accuracy and preserving the ability to measure levels within the full range of the full load of the secondary waveform 142.

The second operational software block 114 is shown as an exemplary condition detection software block 114' that monitors a digital signal received from the second biasing circuitry 108 for detecting values that are outside of a predetermined range of normal values for determining when a condition exists, such as a condition indicative of a malfunction and the need for protective measures. The condition detection software block 114' needs to look at energy levels that are far outside the expected full load that is output as the secondary waveform 142 (e.g., 0-5 amps), such as for detecting a potentially dangerous condition, such as a short circuit, under voltage condition, over voltage condition, a fault, reverse power, etc. For example, the detection software block may need to look at energy levels that are up to twenty times the full load of the expected secondary waveform 142 (e.g., 0-100 amps) for detecting without the need for a high degree of accuracy. The actual operational software blocks 112 and 114 are not limited to the exemplary software blocks 112' and 114' described above, and may perform other digital and or processing functions. In the present example, the second range covers substantially twenty times the full load of the secondary waveform 142 (e.g., the second range is about 0-100 amps) for establishing a large and dynamic range without the need for a high degree of accuracy.

Figure 3:
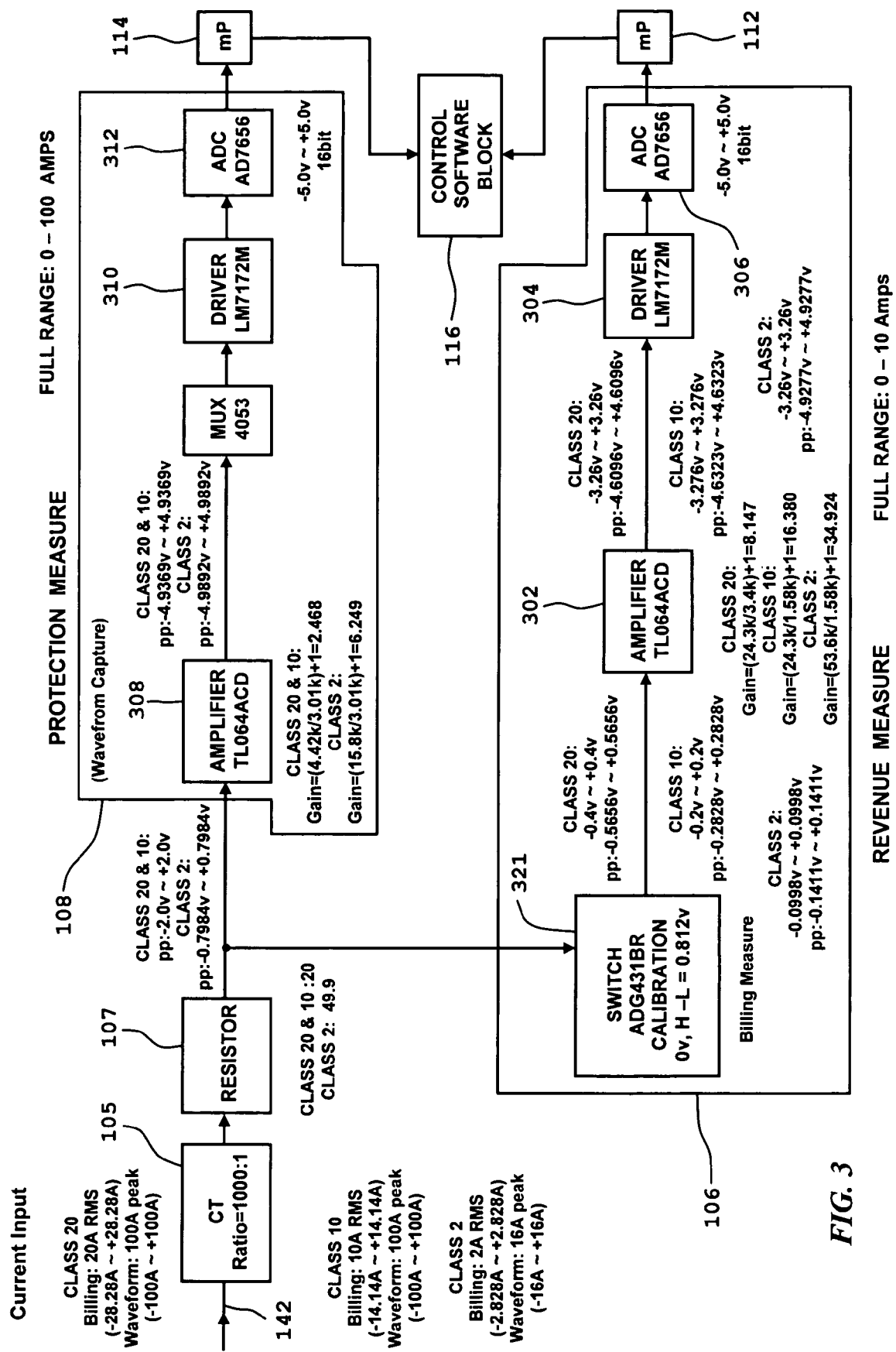
FIG. 3 is a schematic block drawing of a metering device of the power substation shown in FIG. 2.

With reference to FIG. 3, the metering device 102 is shown in greater detail. First biasing circuitry 106 is shown to receive output from transformer 105 and resistor 107, and to include amplifier 302, e.g., a gain amplifier, driver 304 and ADC 306. The output from ADC 306 is provided to the metering software block 112. Second biasing circuitry 108 is shown to receive the same output from transformer 105 and resister 107 as received by the first biasing circuitry 106. The second biasing circuitry 108 is shown to include amplifier 308, e.g., a gain amplifier, driver 310 and ADC 312. The output from ADC 312 is provided to the condition protection software block 114. Control software block 116 receives and processes the output from the metering software bock 112 and the condition detection software block 114.

By setting the gain of each amplifier 302, 308, only one transformer 105 is necessary, eliminating the need for first and second transformers. For example, secondary analog waveform 142 will be sensed by current transformer 105 in this exemplary embodiment having a ratio of 1000:1. For transformer 105 provided as a class 2 transformer, after passing resistor 107, the peak-to-peak voltage entering the first and second biasing circuitry 106, 108 will be approximately −0.7984 V to approximately +0.7984 V. The gain of amplifier 302 will be adjusted to provide the desired biasing gain so the output of the amplifier 302 being fed to the ADC 306 will correspond to 0-10 amps with a peak-to-peak signal of approximately −50 V to approximately +5.0 V. Since the full range of ADC 306 is measuring the 0-10 amps, the measurement is very accurate and suitable for revenue metering.

The gain of amplifier 308 of the second biasing circuitry 108 will be set to a value to provide the desired biasing gain so the output of the amplifier 308 being fed to the ADC 312 will correspond to 0-100 amps with a peak-to-peak signal of approximately −5.0 V to approximately +5.0 V. Therefore, the full range of ADC 312 is approximately 0 to approximately 100 amps.

Optionally, the first biasing circuitry 106 may include a calibration switch 321 used during initial setup and calibration of the metering device 102. In one state of the switch 321, the first biasing circuitry 106 will receive input as measured by transformer 105, e.g., a normal operation mode. In another state of switch 321, the first biasing circuitry 106 will receive a known reference signal via the switch so the various components, e.g., amplifier 302, ADC 306, etc. can be setup and/or calibrated.

Additionally, the control software block 116 operates on the output from the first operational software block 112 and the second operational software block 114, eliminating the need for separate software blocks and/or processors for processing the output from the first and second operational software blocks 112 and 114. The control software block 116 processes the output from the first and second operational software blocks 112 and 114 in a coordinated fashion. The amount of equipment used is reduced, resulting in lower costs and a compact unit housed in housing 150 within which the processors executing the first operational software block 112, second operational software block 114 and control software block 116 are disposed. Costs are further minimized due to reductions in the complexity and quantity of design, wiring and, installation requirements. The compact unit is versatile, such as for performing metering and condition detection functions.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A metering device of a power substation operating on a secondary analog waveform output by a transformer assembly receiving a primary waveform, the metering device comprising:
    a transformer of the metering device for stepping down the secondary waveform and generating an output signal;
    first biasing circuitry for operating on the signal output from the transformer of the metering device for generating a corresponding first digital signal having a value proportional to the signal output from the transformer and within a first range;
    second biasing circuitry for operating on the signal output from the transformer of the metering device for generating a corresponding second digital signal having a value proportional to the signal output from the transformer of the metering device and within a second range; and
    a processor assembly in operative communication with the first and second biasing circuitry, wherein the processor assembly executes application software for receiving the first and second digital signals, the processor assembly comprising:
    a first operational software block for processing the first digital signal and outputting a corresponding first output signal;
    a second operational software block for processing the second digital signal and outputting a corresponding second output signal; and
    a control software block for processing the first and second output signals and generating corresponding output wherein at least one of the first operational software block, the second operational software block and the control software block monitors at least one software block of the other software blocks for detecting an abnormal condition and resets the software block of the at least one software block associated with the detected abnormal condition.

2. The metering device according to claim 1, wherein the processor assembly further comprises a handler software block for processing the output from the control signal for providing corresponding output to at least one of a communication input/output (I/O) device, a display device, and an indicator device.

3. The metering device according to claim 1, wherein the metering device further comprises a digital to analog converter DAC for receiving the output generated by the control software block and generating a corresponding analog retransmit signal.

4. The metering device according to claim 1, wherein the output generated by the control software block is provided to a device for controlling the device.

5. The metering device according to claim 1, wherein each processor of the processor assembly that executes at least a portion of at least one of the first operational software block, second operational software block, and control software block is disposed in one housing.

6. The metering device according to claim 1, wherein each of the transformer and the first and second biasing circuitry are disposed in one housing.

7. The metering device according to claim 1, wherein the first operational software block performs at least one metering function for measuring energy of the secondary waveform.

8. The metering device according to claim 1, wherein the second operational software block performs a condition detection operation for detecting abnormal properties of the secondary waveform.

9. The metering device according to claim 1, wherein the second range is substantially more than two times the first range.

10. The metering device of claim 1 wherein said processor assembly includes at least one processor.

11. The metering device of claim 1 wherein said metering device is an energy measurement device for measuring real time energy usage.

12. A metering device of a power substation operating on a secondary analog waveform output by a transformer assembly receiving a primary waveform, the metering device comprising:
    a transformer of the metering device for stepping down the secondary waveform and generating an output signal;
    first biasing circuitry for operating on the signal output from the transformer of the metering device for generating a corresponding first digital signal having a value proportional to the signal output from the transformer and within a first range;
    second biasing circuitry for operating on the signal output from the transformer of the metering device for generating a corresponding second digital signal having a value proportional to the signal output from the transformer of the metering device and within a second range; and
    a processor assembly in operative communication with the first and second biasing circuitry, wherein the processor assembly executes application software for receiving the first and second digital signals, the processor assembly comprising:
    a first operational software block for processing the first digital signal and outputting a corresponding first output signal;
    a second operational software block for processing the second digital signal and outputting a corresponding second output signal; and
    a control software block for processing the first and second output signals and generating corresponding output wherein the control software block compares the first and second digital signals for detecting a discrepancy there between and generating a corresponding signal.

13. The metering device of claim 12, wherein the processor assembly further comprises a handler software block for processing the output from the control signal for providing corresponding output to at least one of a communication input/output (I/O) device, a display device, and an indicator device.

14. The metering device of claim 12, wherein the metering device further comprises a digital to analog converter DAC for receiving the output generated by the control software block and generating a corresponding analog retransmit signal.

15. The metering device of claim 12, wherein the output generated by the control software block is provided to a device for controlling the device.

16. The metering device of claim 12, wherein each processor of the processor assembly that executes at least a portion of at least one of the first operational software block, second operational software block, and control software block is disposed in one housing.

17. The metering device of claim 12, wherein each of the transformer and the first and second biasing circuitry are disposed in one housing.

18. The metering device of claim 12, wherein the first operational software block performs at least one metering function for measuring energy of the secondary waveform.

19. The metering device of claim 12, wherein the second operational software block performs a condition detection operation for detecting abnormal properties of the secondary waveform.

20. The metering device of claim 12, wherein the second range is substantially more than two times the first range.

21. The metering device of claim 12, wherein said processor assembly includes at least one processor.

22. The metering device of claim 12 wherein said metering device is an energy measurement device for measuring real time energy usage.

23. A metering device of a power substation operating on a secondary analog waveform output by a transformer assembly receiving a primary waveform, the metering device comprising:
a transformer of the metering device for stepping down the secondary waveform and generating an output signal;
first biasing circuitry for operating on the signal output from the transformer of the metering device for generating a corresponding first digital signal having a value proportional to the signal output from the transformer and within a first range;
second biasing circuitry for operating on the signal output from the transformer of the metering device for generating a corresponding second digital signal having a value proportional to the signal output from the transformer of the metering device and within a second range; said first range and said second range at least partially overlapping; and
a processor assembly in operative communication with the first and second biasing circuitry, wherein the processor assembly executes application software for receiving the first and second digital signals, the processor assembly comprising:
a first operational software block for processing the first digital signal and outputting a corresponding first output signal;
a second operational software block for processing the second digital signal and outputting a corresponding second output signal; and
a control software block for processing the first and second output signals and generating corresponding output.

24. The metering device of claim 23 wherein said processor assembly includes at least one processor.

25. The metering device of claim 23 wherein said metering device is an energy measurement device for measuring real time energy usage.

26. The metering device of claim 23 wherein said metering device includes a display of real time energy usage.

27. The metering device of claim 23 wherein said communications transmits information serially.

28. The metering device of claim 23 wherein said communications transmits information in parallel.

29. The metering device of claim 23 wherein said metering device includes an indicator device.

30. The metering device of claim 23 wherein said energy measurement device includes at least one processor for measuring said real time energy usage.

31. A metering device of a power substation operating on a secondary analog waveform output by a transformer receiving a primary waveform, the metering device comprising:
a transformer of the metering device for stepping down the secondary waveform and generating an output signal;
first biasing circuitry for operating on the signal output from the transformer of the metering device for generating a corresponding first digital signal having a value proportional to the signal output from the transformer and within a first range;
second biasing circuitry for operating on the signal output from the transformer of the metering device for generating a corresponding second digital signal having a value proportional to the signal output from the transformer of the metering device and within a second range; and
a processor assembly in operative communication with the first and second biasing circuitry, wherein the processor assembly executes application software for receiving the first and second digital signals, the processor assembly comprising:
a first operational software block for processing the first digital signal and outputting a corresponding first output signal;
a second operational software block for processing the second digital signal and outputting a corresponding second output signal; and
a control software block for processing the first and second output signals and generating corresponding output;
at least one amplifier having its gain set to eliminate a need for a second transformer.

32. The metering device of claim 31 wherein said processor assembly includes at least one processor.

33. The metering device of claim 31 wherein said metering device is an energy measurement device for measuring real time energy usage.

34. The metering device of claim 31 wherein said metering device includes a display of real time energy usage.

35. The metering device of claim 31 wherein said communications transmits information serially.

36. The metering device of claim 31 wherein said communications transmits information in parallel.

37. The metering device of claim 31 wherein said metering device includes an indicator device.

38. The metering device of claim 31 wherein said energy measurement device includes at least one processor for measuring said real time energy usage.

39. A metering device of a power substation operating on a secondary analog waveform output by a transformer assembly receiving a primary waveform, the metering device comprising:

a transformer of the metering device for stepping down the secondary waveform and generating an output signal;

first biasing circuitry for operating on the signal output from the transformer of the metering device for generating a corresponding first digital signal having a value proportional to the signal output from the transformer and within a first range;

second biasing circuitry for operating on the signal output from the transformer of the metering device for generating a corresponding second digital signal having a value proportional to the signal output from the transformer of the metering device and within a second range; and a processor assembly in operative communication with the first and second biasing circuitry, wherein the processor assembly executes application software for receiving the first and second digital signals, the processor assembly comprising:

a first operational software block for processing the first digital signal and outputting a corresponding first output signal;

a second operational software block for processing the second digital signal and outputting a corresponding second output signal; and a control software block for processing the first and second output signals and generating corresponding output; and said metering device is an energy measurement device for measuring real time energy usage.

40. The metering device of claim 39 wherein said metering device includes a display of real time energy usage.

41. The metering device of claim 39 wherein said communications transmits information serially.

42. The metering device of claim 39 wherein said communications transmits information in parallel.

43. The metering device of claim 39 wherein said metering device includes an indicator device.

44. The metering device of claim 39 wherein said energy measurement device includes at least one processor for measuring said real time energy usage.

* * * * *